(12) United States Patent
Sakamoto et al.

(10) Patent No.: US 6,333,523 B1
(45) Date of Patent: Dec. 25, 2001

(54) FIELD-EFFECT TRANSISTOR

(75) Inventors: Ryoji Sakamoto; Tatsuya Hashinaga, both of Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/427,750

(22) Filed: Oct. 27, 1999

(30) Foreign Application Priority Data

Oct. 30, 1998 (JP) ................................................ 10-310700

(51) Int. Cl.[7] ....................... H01L 29/06; H01L 31/0328; H01L 29/76; H01L 21/338
(52) U.S. Cl. ......................... 257/192; 257/24; 257/201; 257/214; 438/172; 438/167
(58) Field of Search ..................................... 257/368, 369, 257/367, 192, 194, 195, 201, 205, 206, 24, 213, 214; 438/167, 172

(56) References Cited

U.S. PATENT DOCUMENTS

| 5,493,136 | * | 2/1996 | Matsuzaki et al. | 257/287 |
| 6,049,097 | * | 4/2000 | Hida | 257/192 |
| 6,064,082 | * | 5/2000 | Kawai et al. | 257/192 |
| 6,121,641 | * | 9/2000 | Ohno | 257/192 |
| 6,144,048 | * | 11/2000 | Suemitsu et al. | 257/192 |
| 6,147,370 | * | 11/2000 | Kanamori | 257/192 |
| 6,180,968 | * | 1/2001 | Kasahara et al. | 257/192 |
| 6,184,546 | * | 2/2001 | Liu et al. | 257/192 |
| 6,184,547 | * | 2/2001 | Onda | 257/194 |
| 6,194,747 | * | 2/2001 | Onda | 257/192 |
| 6,201,267 | * | 3/2001 | Gupta et al. | 257/206 |
| 6,255,673 | * | 7/2001 | Kuzuhara | 257/192 |
| 6,262,444 | * | 7/2001 | Hori et al. | 257/192 |
| 6,274,893 | * | 8/2001 | Igarashi et al. | 257/192 |

FOREIGN PATENT DOCUMENTS 4-101436   4/1992   (JP) .

OTHER PUBLICATIONS

Article entitled "GaAs FETs With Graded Channel Doping Profiles", from Electronics Letters, XP002128687; pp. 408–409, by R. Willaims et al., (1977).
Article entitled "X–Band Monolithic Four–Stage LNA with Pulse–Doped GAAS Mesfets", USA Technical Digest, Oct. 1999; pp. 237–240, by Shiga et al.

* cited by examiner

Primary Examiner—Matthew Smith
Assistant Examiner—Chuong A Luu
(74) Attorney, Agent, or Firm—Smith, Gambrell & Russell, LLP

(57) ABSTRACT

The present invention relates to a field-effect transistor which is improved such that the linearity of mutual conductance $g_m$ is flattened over a wider range of gate bias. This field-effect transistor is a MESFET comprising a channel layer and a cap layer in Schottky-contact with a gate electrode. In particular, between the channel layer and the cap layer, one or more auxiliary layers having a doping concentration lower than that of the channel layer and higher than that of the cap layer are provided. The doping concentration of one or more auxiliary layers is set such that the doping profile of a laminated structure constituted by the channel layer, one or more auxiliary layers, and cap layer exponentially lowers from the channel layer toward the cap layer. According to this configuration, the depletion layer can effectively be controlled over a wider range of gate bias, the long gate effect and the like are suppressed, and the linearity of mutual conductance $g_m$ is improved.

5 Claims, 4 Drawing Sheets

DISTANCE FROM GATE ELECTRODE (Å)

FIELD-EFFECT TRANSISTOR

BACKGROUND OF THE INVENTION

1. Field of the Invention

The present invention relates to structures of field-effect transistor (FET).

2. Related Background Art

As FETs realizing ultrafast operations, there have been known those employing a pulse-doped structure in a channel layer. The pulse-doped structure is a structure in which a channel layer with a high doping concentration is formed directly under an undoped layer (cap layer). The cap layer has a predetermined thickness from the substrate surface on which a gate electrode is formed on the cap layer. FETs having the pulse-doped structure are disclosed, for example, in U.S. Pat. No. 4,163,984 or Japanese Patent Application Laid-Open No. HEI 6-310535.

In n-type FETs having the pulse-doped structure, a long gate effect may occur. The long gate effect is a phenomenon in which, the effective gate length enhances due to a depletion layer on the drain electrode side (where the gate bias is a small negative value). For suppressing the long gate effect, the FET disclosed in Japanese Patent Application Laid-Open No. HEI 4-225533, for example, employs a double-pulse-doped layer structure. The double-pulse-doped layer structure is a structure further comprising a pulse-doped layer (additional doped layer) which is disposed over a channel layer. The channel layer and the additional doped layer are separated from each other by a predetermined distance by an undoped layer (a part of a cap layer). The additional doped layer inhibits the depletion layer from spreading toward the channel layer.

SUMMARY OF THE INVENTION

As a result of studies concerning conventional field-effect transistors, the inventors have found the following problems.

In an FET having the conventional doping configuration, if the bias voltage to the gate electrode is positive, the depletion layer generated may fail to reach the additional doped layer or may not completely deplete the additional doped layer. In such cases, the additional doped layer itself may operate as a current channel together with the channel layer (hereinafter referred to as conductive-channeling of the additional doped layer). The conductive-channeling of the additional doped layer makes it impossible to keep the linearity of mutual conductance $g_m$ of the FET.

On the other hand, the drain breakdown voltage of FET strongly depends on the distance between the gate electrode and the channel layer. If the distance between the gate electrode and the channel layer is enhanced in order to improve the drain breakdown voltage, then the conductive-channeling of the additional doped layer becomes particularly influenced.

An object of the present invention is to provide a field-effect transistor comprising a structure which improves the linearity of mutual conductance $g_m$.

The field-effect transistor of the present invention comprises a channel layer disposed on a substrate, an auxiliary region disposed on the channel layer, and a cap layer disposed on the auxiliary region. A gate electrode is disposed on the cap layer. The channel layer is disposed at a position separated from the gate electrode by at least 600 angstroms.

The auxiliary region is positioned between the cap layer and the channel layer, and has an upper interface directly in contact with the cap layer and a lower interface directly in contact with the channel layer. The auxiliary region has a doping concentration lower than that of the channel layer and higher than that of the cap layer.

The auxiliary region comprises one or more auxiliary layers each having a conductivity type identical to that of the channel layer. The doping concentration of the one or more auxiliary layers may be set such that the doping profile of a laminated structure constituted by the channel layer, the one or more auxiliary layers, and the cap layer exponentially lowers from the channel layer toward the cap layer.

The existence of the auxiliary layers inhibits the depletion layer from spreading to the channel layer (suppresses the long gate effect and the like). Since the channel layer and the auxiliary layer are directly in contact with each other, only the channel layer acts as a current channel even in the case where the gate bias is positive or small negative. These characteristics improve the linearity of mutual conductance $g_m$ over a wide range of gate bias. In particular, increasing the number of auxiliary layers enables a high linearity in mutual conductance $g_m$.

As the cap layer is further provided on one or more auxiliary layers, a planar type field-effect transistor having a high drain breakdown voltage is obtained.

The doping concentrations of the channel layer, one or more auxiliary layers, and cap layer, with respect to the distance x along an axis directed from the gate electrode to the channel layer, substantially coincide with the following exponential function:

$$N = A \exp(\alpha x)$$

where A and $\alpha$ are constants.

When the function indicative of the decrease in doping concentration of each layer is made to approximately coincide with an exponential function, the linearity in mutual conductance $g_m$ improves in particular.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
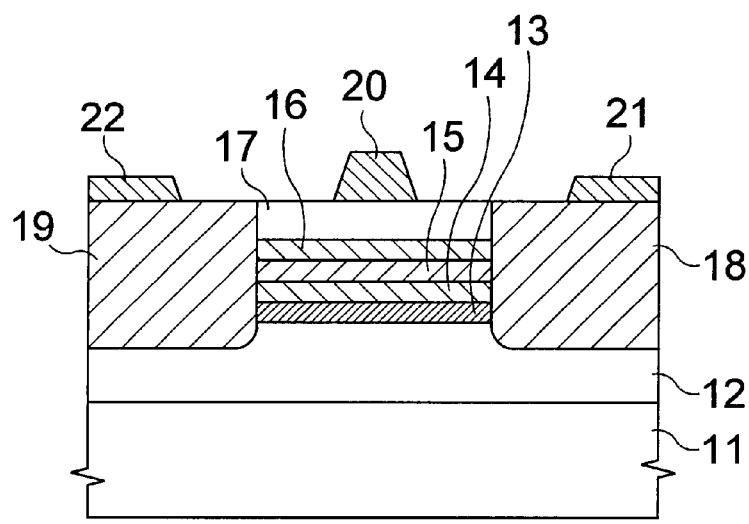
FIG. 1 is a sectional view showing a configuration of an embodiment of the field-effect transistor according to the present invention.

In the following, embodiments of the field-effect transistor according to the present invention will be explained in detail with reference to FIGS. 1, 2, 3A to 4B, 5, and 6. The ratios of dimensions in the drawings do not always coincide with those explained.

FIG. 1 is a sectional view showing the configuration of a Schottky-contact type FET (MESFET) which is an embodiment of the field-effect transistor of the present invention.

In FIG. 1, on a semi-insulating GaAs semiconductor substrate 11, a p⁻-type GaAs buffer layer 12 is disposed. The buffer layer 12 has a thickness of 0.3 to 2 $\mu$m and a low doping concentration of about ×10$^{16}$ cm$^{-3}$ or less. An n-type channel layer 13 having a predetermined doping concentration is disposed on the buffer layer 12. The channel layer 13 is made of Si-doped GaAs and has a thickness of 50 to 500 angstroms.

On the channel layer 13, one or more n-type auxiliary layers made of Si-doped GaAs are disposed. In this embodiment, there are three auxiliary layers. Namely, from the channel layer 13 side, a first auxiliary layer 14, a second auxiliary layer 15, and a third auxiliary layer 16 are successively disposed. Each of the channel layer 13, first auxiliary layer 14, second auxiliary layer 15, and third auxiliary layer 16 is doped with n-type Si impurities. The doping concentration in each layer is controlled, for example, by changing the flow rate of SiH$_4$ gas supplied during crystal growth in the case of OMVPE techniques. In the case where the crystal growth is carried out by an MBE technique, their doping concentrations are controlled by changing the molecular beam intensity of Si. The total doping concentrations in the channel layer 13, first auxiliary layer 14, second auxiliary layer 15, and third auxiliary layer 16, and their relationships will be explained later.

On the topmost third auxiliary layer 16, an n⁻-type GaAs cap layer 17 is disposed. The cap layer 17 has a thickness of 100 to 1000 angstroms. As with the buffer layer 12, the cap layer 17 has a low doping concentration of about 1×10$^{16}$ cm$^{-3}$ or less. On the cap layer 17, a Schottky-contacted gate electrode 20 is disposed.

Disposed at the both sides of the gate electrode 20 are an n⁺-type drain region 18 and source region 19 into which Si ions with high dose are selectively implanted. The drain region 18 and the source region 19 are provided with a drain electrode 21 and a source electrode 22 which are in ohmic contact with the respective n⁺-type regions 18, 19. In this embodiment, the gate electrode 20 is installed at a position equidistant from the drain electrode 21 and the source electrode 22. As another structure, for enhancing the drain breakdown voltage, the gate electrode 20 may be disposed at a position which is farther from the drain electrode 21 than from the source electrode 22.

The doping concentration through the channel layer 13, first auxiliary layer 14, second auxiliary layer 15, and third auxiliary layer 16 is set so as to successively decrease from the channel layer 13 to the gate electrode 20. Its preferred concentration range is, for example, 1 to 3×10$^{18}$ cm$^{-3}$ in the channel layer 13, 0.5 to 1×10$^{18}$ cm$^{-3}$ in the first auxiliary layer 14, 2 to 5×10$^{17}$ cm$^{-3}$ in the second auxiliary layer 15, and 0.1 to 2×10$^{17}$ cm$^{-3}$ in the third auxiliary layer 16.

Figure 2:
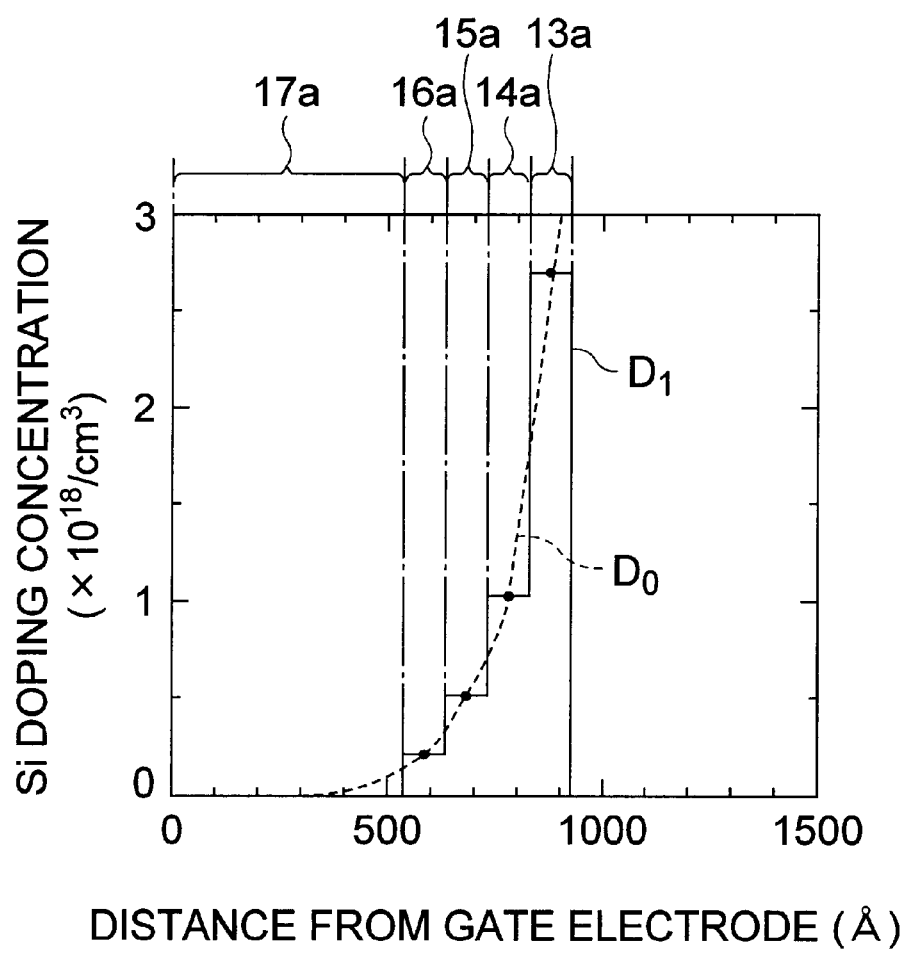
FIG. 2 is a graph showing an example of doping profile of the field-effect transistor shown in FIG. 1.

FIG. 2 is a doping profile indicating the Si concentration in the part located under the gate electrode 20 in the FET shown in FIG. 1. The solid line D$_1$ indicates the doping profile in this embodiment. The abscissa of this graph indicates the distance x (angstroms) from the gate electrode 20, i.e., the distance x along an axis which is directed from the interface between the gate electrode 20 and the cap layer 17 to the channel layer 13. The ordinate indicates the doping concentration N (×10$^{18}$ $^{cm-3}$) of n-type Si impurities. In the graph, regions 13a to 17a dividing the distance from the gate electrode 20 correspond to the channel layer 13, first auxiliary layer 14, second auxiliary layer 15, third auxiliary layer 16, and cap layer 17 shown in FIG. 1, respectively.

The thickness and doping concentration in each layer in this embodiment are set as follows:

the channel layer 13 has a thickness of 80 angstroms and a concentration of 2.7×10$^{18}$ cm$^{-3}$;

the first auxiliary layer 14 has a thickness of 100 angstroms and a concentration of 1.0×10$^{18}$ cm$^{-3}$;

the second auxiliary layer 15 has a thickness of 100 angstroms and a concentration of 5.0×10$^{17}$ cm$^{-3}$;

the third auxiliary layer 16 has a thickness of 100 angstroms and a concentration of 2.0×10$^{17}$ cm$^{-3}$; and the cap layer 17 has a thickness of 550 angstroms and a concentration of less than 1.0×10$^{16}$ cm$^{-3}$. Also, this embodiment is an embodiment in which the threshold voltage V$_{th}$ is set to −2.3 V.

In this embodiment, each of the regions 13a to 16a has a constant doping concentration therewithin. Their individual doping concentrations are set so as to form a step-like doping profile lowering stepwise from the region 13a to the region 16a. Between the region 16a and the substrate surface where the gate electrode 20 is formed, the region 17a corresponding to the undoped cap layer 17 is disposed.

The carrier distribution is expressed by a Poisson's equation. The inventors have studied conditions concerning the doping profile according to numerical experiments using the Poisson's equation. As a result, for improving the linearity of mutual conductance g$_m$, it has been found preferable to form the doping profile so as to make it conform to an exponential function of N=A exp($\alpha$x). In this embodiment, the respective doping concentrations of the layers 13 to 16 are set such that the relationship between the doping profile and the distance from the gate electrode is approximately represented by a predetermined exponential function. In FIG. 2, this approximate exponential function is indicated by the dotted line D$_0$.

Specifically, the doping profile is formed such that, letting the respective center positions of the regions 13a to 16a in the distance direction from the gate electrode be x$_0$, x$_1$, x$_2$, and x$_3$, the respective doping concentrations be N$_0$, N$_1$, N$_2$, and N$_3$, and the function expressing the curve D$_0$ indicated by the dotted line be N=A exp($\alpha$x) where A and $\alpha$ are constants, N$_0$=A exp($\alpha$x$_0$), N$_1$=A exp($\alpha$x$_1$), N$_2$=A exp($\alpha$x$_2$), and N$_3$=A exp($\alpha$x$_3$) approximately hold true.

Mathematically, the linearity of mutual conductance g$_m$ becomes flat with respect to the gate bias as the coefficient $\alpha$ of the exponential function is greater (the rate of increase is greater). In practice, however, all the doping concentrations are finite values, and various conditions such as the electron mobility vary depending on the doping concentration. As a consequence, because of the fact that characteristics would conversely deteriorate when $\alpha$ is too large, and due to other restrictions in manufacture, such a doping profile as that shown in FIG. 2, for example, is preferable.

Though the auxiliary region comprises three layers in this embodiment, the number of layers should not be restricted thereto. The number of auxiliary layers may vary with their respective thicknesses (thickness per layer) being changed. In this case, the linearity of mutual conductance $g_m$ will improve if the doping profile is made to substantially coincide with the exponential function in a manner similar to that mentioned above. In a structure in which the number of auxiliary layers is increased, it is important to cause the doping profile concerning the auxiliary layers to conform to the exponential function in order to improve the linearity of mutual conductance $g_m$. As the function to which the doping profile should conform, functions decreasing toward the gate electrode 20 other than the above-mentioned exponential function may be employed as well.

Figure 3A:
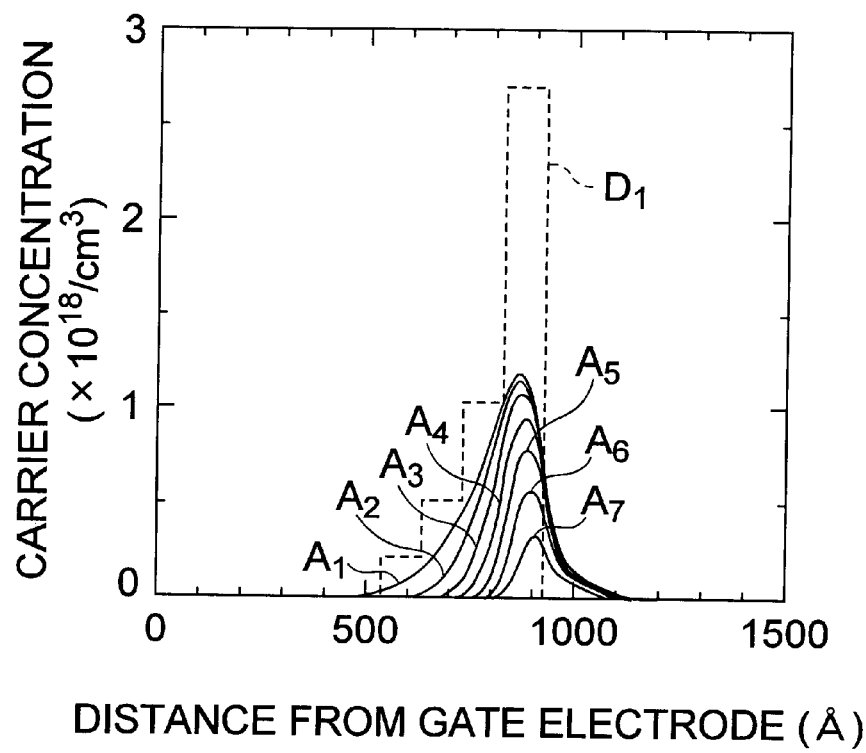
FIGS. 3A and 3B are graphs showing operation characteristics of the field-effect transistor of the doping profile shown in FIG. 2, indicating the dependence of carrier concentration upon distance and the dependence of change in carrier concentration upon distance, respectively.

Operation of the FET having the doping profile shown in FIG. 2 will now be explained with reference to FIGS. 3A and 3B. FIG. 3A shows the distribution of the carriers in the FET of the present invention under the various gate bias conditions. In the graph of FIG. 3A, the abscissa indicates the distance from the gate electrode (angstroms), whereas the ordinate shows the carrier (electron) concentration ($\times 10^{18}$ cm$^{-3}$). For comparison, the doping profile shown in FIG. 2 is indicated by the dotted line $D_1$.

In curves $A_1$ to $A_7$ indicating carrier concentration, the gate bias $V_g$ is set (within the range of 0.4 to −2.0 V in decrements of 0.4 V) as follows: $A_1$: $V_g$=0.4 V; $A_2$: $V_g$=0.0 V; $A_3$: $V_g$=−0.4 V; $A_4$: $V_g$=−0.8 V; $A_5$: $V_g$=−1.2 V; $A_6$: $V_g$=−1.6 V; $A_7$: $V_g$=−2.0 V. When the gate bias is positive or a small negative, the carrier concentration has such a form that a portion on the gate electrode 20 side spreads to regions outside the channel layer 13. While the total carriers is reduced by the spread of depletion layer as the gate bias becomes large negative, the peak position of carrier concentration always exists within the region 13a.

Figure 3B:
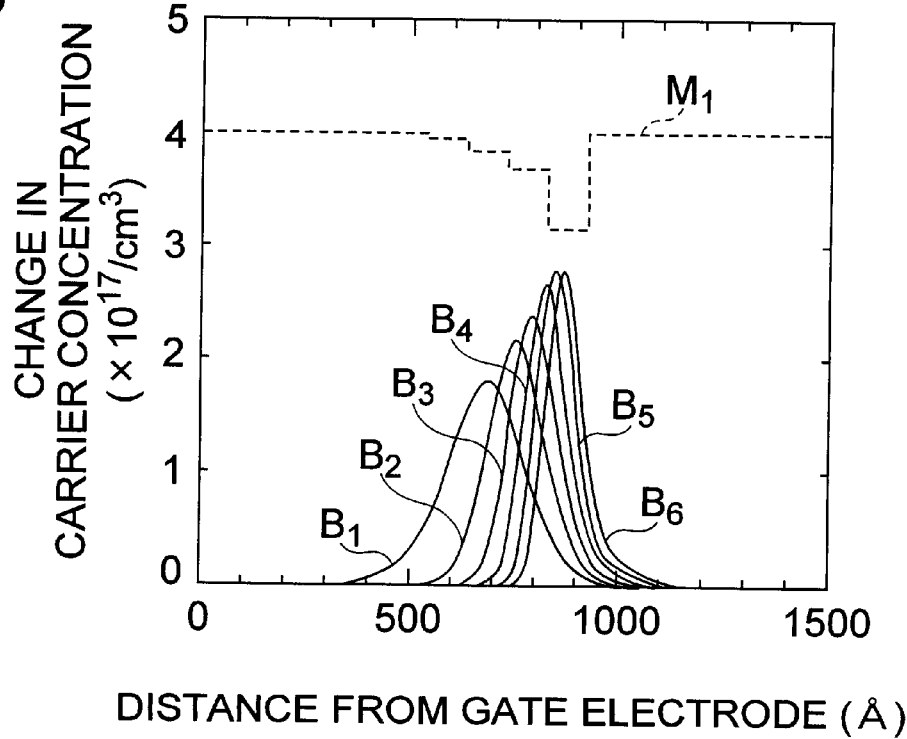

FIG. 3B shows differences between every two curves in FIG. 3A. Curves $B_1$ to $B_6$ are given by the respective carrier concentration differences corresponding to $A_1$-$A_2$, $A_2$-$A_3$, $A_3$-$A_4$, $A_4$-$A_5$, $A_5$-$A_6$, and $A_6$-$A_7$. The suppression of the change in carrier concentration is more clear in this graph. The change in carrier concentration is confined within a region near the channel layer because the laminated structure constituted by the first auxiliary layer 14, second auxiliary layer 15, and third auxiliary layer 16 inhibits the depletion layer from spreading toward the channel layer. The dotted line $M_1$ shown in FIG. 3B indicates the electron mobility (expressed by an arbitrary unit), and the mobility is lowered in the regions doped with Si impurities under the influence of impurity scattering.

Figure 4A:
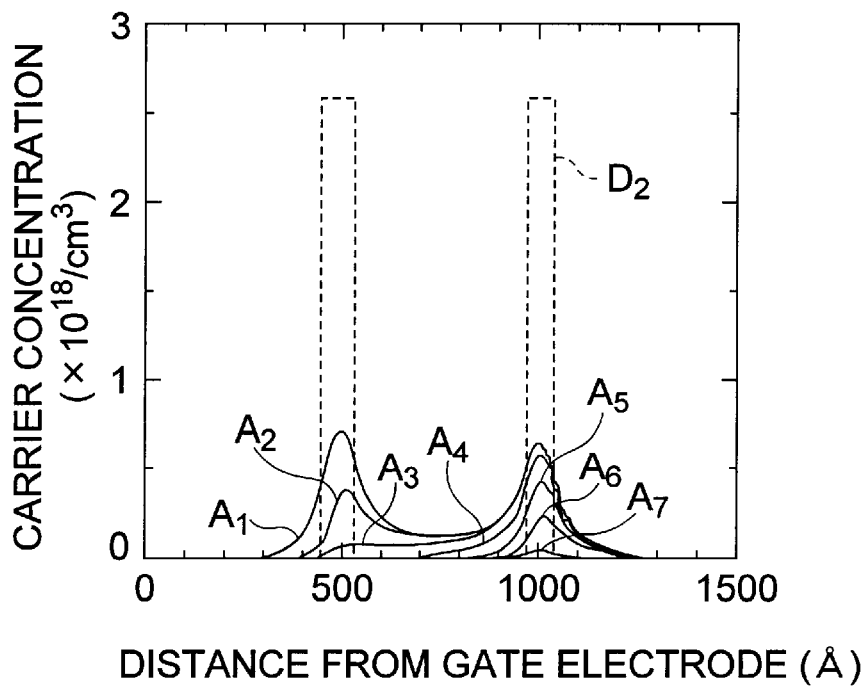
FIGS. 4A and 4B are graphs showing operation characteristics of an example of field-effect transistors having a double-pulse-doped layer structure, indicating the dependence of carrier concentration upon distance and the dependence of change in carrier concentration upon distance, respectively.
Figure 4B:
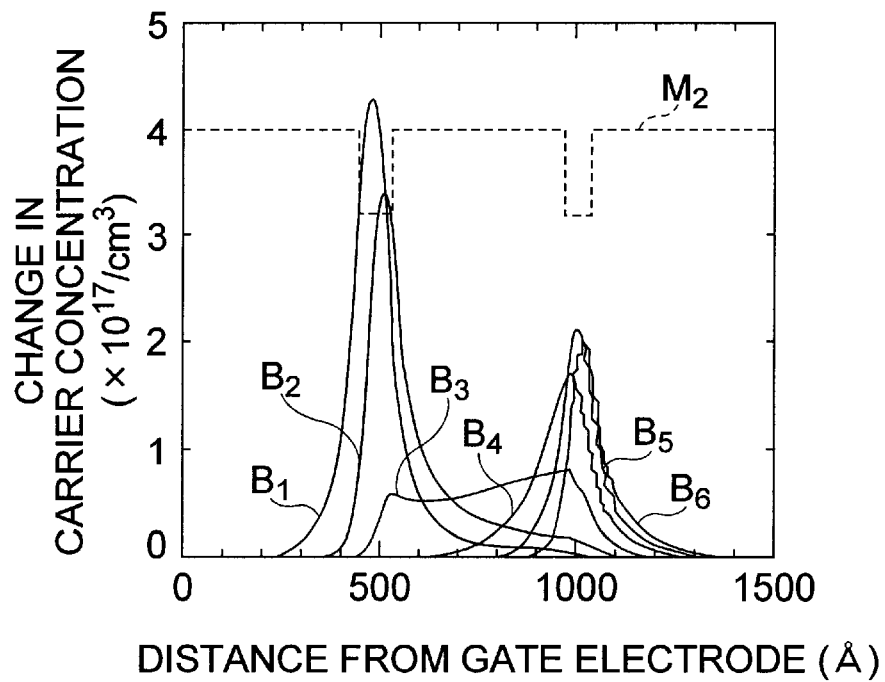

FIGS. 4A and 4B shows the calculation concerning a conventional MESFET having a double-pulse-doped layer structure as a comparative example. As with FIGS. 3A and 3B, FIG. 4A shows the dependence of the carrier concentration upon distance ($\times 10^{18}$ cm$^{-3}$), whereas FIG. 4B shows the dependence of the change in carrier concentration upon distance ($\times 10^{17}$ cm$^{-3}$). The doping profile in this comparative example is indicated by the dotted line $D_2$ in FIG. 4A. Of the two regions doped with Si impurities at a high concentration, the layer where the distance from the gate electrode is about 500 angstroms corresponds to the additional doped layer, whereas the other layer where the distance is about 1000 angstroms corresponds to the channel layer. The change in electron mobility is indicated by the dotted line $M_2$ in FIG. 4B. The curves $A_1$ to $A_7$ in FIG. 4A and the curves $B_1$ to $B_7$ in FIG. 4B correspond to those in FIGS. 3A and 3B, respectively.

In the FET of the comparative example, as indicated by the curves $A_1$ to $A_3$ in FIG. 4A, for example, when the gate bias is positive, zero, or a small negative, the depletion layer cannot reach the additional doped layer or cannot completely deplete the additional doped layer (the conductive-channeling of the additional doped layer occurs). Also, at such a gate bias condition, carriers would be distributed in the region between the additional doped layer and the channel layer. Consequently, as shown in FIG. 4B, the change in carrier concentration varies greatly toward the channel layer and its adjacent region as the gate bias is negatively enhanced.

Figure 5:
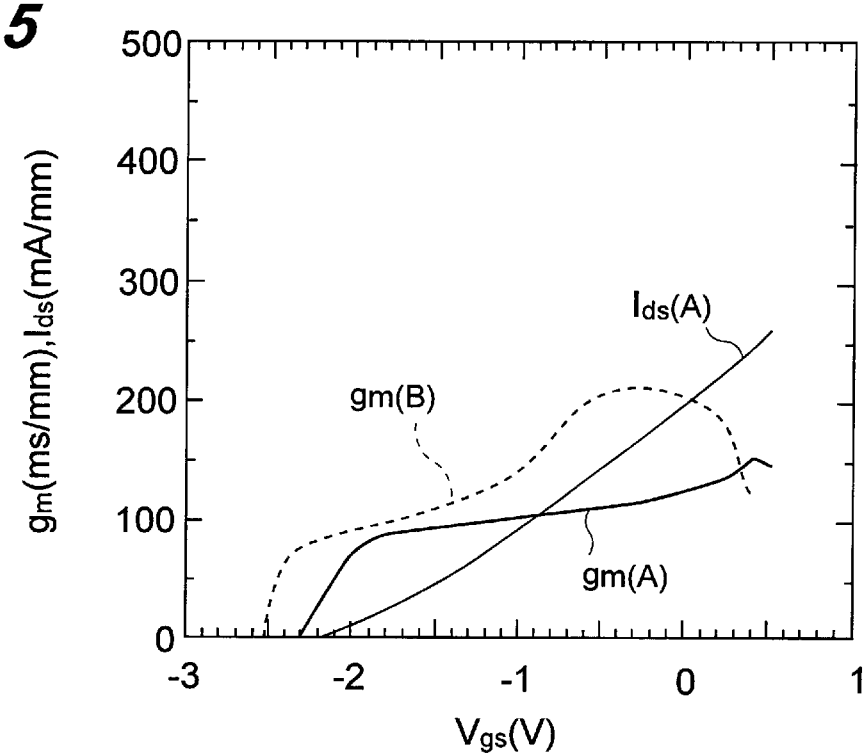
FIG. 5 is a graph showing the dependence of mutual conductance and current upon gate bias.

Such changes greatly influence the linearity of mutual conductance $g_m$. FIG. 5 is a graph showing the changes in current $I_{ds}$ and mutual conductance $g_m$ ($g_m$ (A)) in the FET (having the doping profile shown in FIG. 2) of the present invention with respect to gate bias. In this graph, the abscissa indicates the gate-source voltage $V_{gs}$ (V), whereas the ordinate indicates the mutual conductance $g_m$ (ms/mm) and the drain-source current $I_{ds}$ (mA/mm). For the mutual conductance $g_m$, the result obtained by the FET (having the doping profile shown in FIG. 4A) of the comparative example is indicated by the dotted line ($g_m$ (B)).

As can be seen from this graph, the current $I_{ds}$ exhibits a high linearity in the FET of the present invention. The mutual conductance $g_m$ varies greatly in the FET of the comparative example, in particular within the range where the gate bias is positive or small negative, due to the conductive-channeling of the additional doped layer. In the FET of the present invention, by contrast, the change in mutual conductance $g_m$ is small even in the range where the gate bias is positive or small negative, thus yielding substantially a constant value over a wide range. These results correspond to the changes in carrier concentration shown in FIGS. 3B and 4B, respectively.

In the FET of the comparative example having a double-pulse-doped layer structure, the additional doped layer does not sufficiently inhibit the depletion layer from spreading toward the channel layer. In the FET of the present invention, by contrast, the auxiliary layers sufficiently inhibit the depletion layer.

Figure 6:
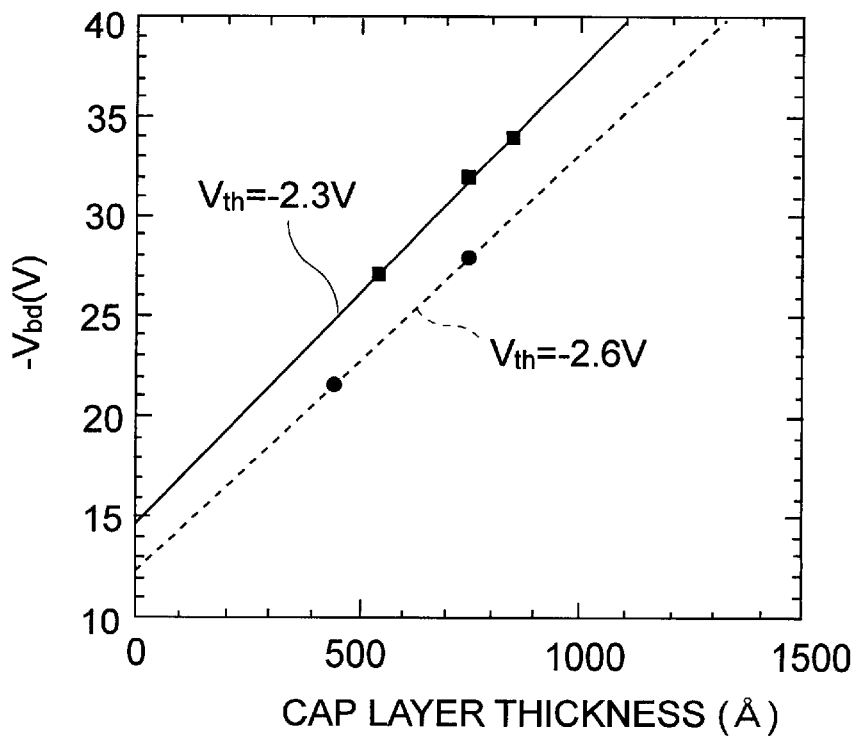
FIG. 6 is a graph showing the dependence of drain breakdown voltage upon cap layer thickness.

The drain breakdown voltage between the gate electrode and drain electrode of the FET depends on the distance between the gate electrode and the channel layer. Enhancing the distance between the gate electrode and the channel layer can improve the drain breakdown voltage. In this specification, the drain breakdown voltage is defined by the gate-drain voltage $V_{bd}$ at which a current of 1 mA flows between the gate and the drain per 1 mm of gate width. FIG. 6 shows the dependence of drain breakdown voltage upon the thickness of cap layer (angstroms) in the case where the threshold voltage $V_{th}$ is fixed at −2.3 V as in the embodiment shown in FIG. 2. Also, the case where $V_{th}$=−2.6 V is indicated by the dotted line in FIG. 6.

From these graphs, it can be seen that the drain breakdown voltage improves as the cap layer is made thicker. If the drain breakdown voltage characteristic is thus improved by thickening the cap layer, then the FET having a double-pulse-doped layer structure shown in FIG. 4B generates the conductive-channeling in the additional doped layer. In addition, as shown in FIG. 5, the linearity of mutual conductance $g_m$ is lost (the additional doped layer functions as a channel layer). The FET of the present invention, by contrast, has no undoped or low-doped layer between the channel layer and the auxiliary layer. As a consequence, even when the thickness of the cap layer is enhanced, no current channel is formed at positions other than those within and near the channel layer. Therefore, the linearity of mutual conductance $g_m$ is improved.

In accordance with the present invention, as explained in detail in the foregoing, an auxiliary region comprising one or more layers is disposed between the channel layer and the cap layer. In particular, since the doping concentration of a laminated structure including the one or more auxiliary layers is set so as to successively decrease from the channel layer side, the control over the spread of depletion layer and the suppression of the long gate effect are realized by the existence of the auxiliary layers. In addition, the linearity of mutual conductance $g_m$ is effectively improved.

From the invention thus described, it will be obvious that the embodiments may be varied in many ways. Such variations are not to be regarded as a departure from the spirit and scope of the invention, and all such modifications as would be obvious to one skilled in the art are intended for inclusion within the scope of the following claims.

What is claimed is:

1. A field-effect transistor comprising:
   a cap layer on which a gate electrode is provided;
   a channel layer provided on the reverse side of said gate electrode with respect to said cap layer, said channel layer being separated from said gate electrode by at least 600 angstroms; and
   one or more auxiliary layers provided between said cap layer and said channel layer, said one or more auxiliary layers each having a conductivity type identical to that of said channel layer, the doping profile of a laminated structure, which is constituted by said channel layer, said one or more auxiliary layers and said cap layer, successively decreasing from said channel layer toward said cap layer.

2. A field-effect transistor according to claim 1, wherein the doping concentration of said one or more auxiliary layers is set such that the doping profile of said laminated structure exponentially decreases from said channel layer toward said cap layer.

3. A field-effect transistor comprising:
   a cap layer on which a gate electrode is directly provided;
   a channel layer provided on the reverse side of said gate electrode with respect to said cap layer, said channel layer being separated from said gate electrode by at least 600 angstroms; and
   an auxiliary region provided between said cap layer and said channel layer, said auxiliary region having an upper interface directly in contact with said cap layer and a lower interface directly in contact with said channel layer, said auxiliary region having a doping concentration lower than that of said channel layer and higher than that of said cap layer.

4. A field-effect transistor according to claim 3, wherein said auxiliary region comprises one or more auxiliary layers each having a conductivity type identical to that of said channel layer.

5. A field-effect transistor according to claim 4, wherein the doping concentration of said one or more auxiliary layers is set such that the doping profile of a laminated structure constituted by said channel layer, said one or more auxiliary layers, and said cap layer exponentially decreases from said channel layer toward said cap layer.

* * * * *